US009960734B2

(12) United States Patent
Chen et al.

(10) Patent No.: US 9,960,734 B2
(45) Date of Patent: May 1, 2018

(54) SYSTEMS AND METHODS FOR GRAPHENE MECHANICAL OSCILLATORS WITH TUNABLE FREQUENCIES

(71) Applicant: The Trustees Of Columbia University In The City Of New York, New York, NY (US)

(72) Inventors: Changyao Chen, Evanston, IL (US); James Hone, New York, NY (US); Sunwoo Lee, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 612 days.

(21) Appl. No.: 14/522,534

(22) Filed: Oct. 23, 2014

(65) Prior Publication Data

US 2017/0025998 A1    Jan. 26, 2017

Related U.S. Application Data

(60) Provisional application No. 61/894,800, filed on Oct. 23, 2013.

(51) Int. Cl.
*H03B 5/32* (2006.01)
*H03B 5/30* (2006.01)
(Continued)

(52) U.S. Cl.
CPC ............... *H03B 5/30* (2013.01); *G01J 5/046* (2013.01); *G01J 5/44* (2013.01); *H01L 21/0262* (2013.01); *H01L 29/00* (2013.01); *H01L 29/0673* (2013.01); *H01L 29/165* (2013.01); *H01L 29/84* (2013.01); *H01L 41/18* (2013.01);
(Continued)

(58) Field of Classification Search
CPC ..... H01L 29/84; H01L 29/0673; H01L 23/91; H01L 23/3171; H01L 29/165; H01L 21/02532; H01L 21/0262; H01L 29/66431; H01L 21/02181; H01L 21/0228; H01L 29/517; H01L 29/00; H01L 41/18;
(Continued)

(56) References Cited

U.S. PATENT DOCUMENTS 9,425,765 B2 * 8/2016 Rinaldi ................... G01J 5/046
2011/0260802 A1 * 10/2011 Villanueva Torrijo H03B 5/326
331/156

(Continued)

OTHER PUBLICATIONS

SU-8 2000 PErmanent Epoxy Negative Photoresist Processing Guidelines for:SU-8-2000.5 (please see exhibit A) attached in office action. www.microchem.com.*

(Continued)

*Primary Examiner* — Arnold Kinkead
(74) *Attorney, Agent, or Firm* — Baker Botts LLP

(57) ABSTRACT

A nano-electro-mechanical systems (NEMS) oscillator can include an insulating substrate, a source electrode and a drain electrode, a metal local gate electrode, and a micron-sized, atomically thin graphene resonator. The source electrode and drain electrode can be disposed on the insulating substrate. The metal local gate electrode can be disposed on the insulating substrate. The graphene resonator can be suspended over the metal local gate electrode and define a vacuum gap between the graphene resonator and the metal local gate electrode.

21 Claims, 6 Drawing Sheets

(51) Int. Cl.
*H01L 21/02* (2006.01)
*H03H 3/02* (2006.01)
*H03H 9/17* (2006.01)
*H01L 29/84* (2006.01)
*H01L 29/06* (2006.01)
*H01L 29/165* (2006.01)
*H03H 9/02* (2006.01)
*H01L 29/00* (2006.01)
*G01J 5/04* (2006.01)
*G01J 5/44* (2006.01)
*H01L 41/18* (2006.01)

(52) U.S. Cl.
CPC .......... *H03H 3/02* (2013.01); *H03H 9/02244* (2013.01); *H03H 9/02433* (2013.01); *H03H 9/17* (2013.01); *H03B 2200/0022* (2013.01); *H03B 2200/0048* (2013.01); *H03B 2201/0266* (2013.01)

(58) Field of Classification Search
CPC ........ H03H 9/02244; H03H 3/02; H03H 9/17; G01J 5/046; G01J 5/44
USPC .................. 438/50; 257/192, 414, 415, 522; 331/107 A, 154, 156
See application file for complete search history.

(56) References Cited

U.S. PATENT DOCUMENTS

2013/0062104 A1    3/2013  Craighead et al.
2016/0056304 A1*  2/2016  Kim .................. H01L 29/66439
                                                    257/192
2016/0099701 A1*  4/2016  Rinaldi .................... G01J 5/20
                                                     422/90

OTHER PUBLICATIONS

Feng et al., "A self-sustaining ultrahigh-frequency nanoelectromechanical oscillator," Nature Nanotechnology 3:342-346 (2008).

Luo et al., "Tunable Gigahertz Oscillators of Gliding Incommensurate Bilayer Graphene Sheets," Journal of Applied Mechanics 80:040906.1-040906.4 (2013).

Nguyen, "MEMS technology for timing and frequency control," Ultrasonics, Ferroelectrics and Frequency Control, IEEE Transactions 54(2):251-270 (2007).

Villanueva et al., "A Nanoscale Parametric Feedback Oscillator," Kavli Nanoscience Institute, California Institute of Technology, Pasadena, CA, pp. 1-17 (2011).

\* cited by examiner

SYSTEMS AND METHODS FOR GRAPHENE MECHANICAL OSCILLATORS WITH TUNABLE FREQUENCIES

CROSS-REFERENCE TO RELATED APPLICATIONS

This application claims priority to U.S. Provisional Application Ser. No. 61/894,800, filed on Oct. 23, 2013, which is incorporated by reference herein in its entirety for all purposes.

GRANT INFORMATION

This invention was made with government support under Grant No. FA9550-09-1-0705 awarded by the Air Force Office of Scientific Research. The government has certain rights in the invention.

BACKGROUND

The disclosed subject matter relates to methods and systems for mechanical oscillators. Oscillators can produce continuous periodic signals from direct current (DC) power. Such oscillators can be utilized in communication systems, including, but not limited to, applications such as timing references and frequency modulators. Certain oscillators can include macroscopic mechanical resonators, such as quartz crystals, which can utilize unsuitably large off-chip space for certain applications.

Micro-electro-mechanical systems (MEMS) oscillators, which can be integrated on-chip, can demonstrate frequency stability and high resonant frequency, among other attributes. However, MEMS oscillators can occupy large footprints on integrated circuits level, and because they achieve high frequency through large mechanical stiffness, frequency tunability can be limited. Such MEMS oscillators are, therefore, not well suited for implementing voltage-controlled oscillators (VCOs). In contrast, Nano-electro-mechanical systems (NEMS) oscillators can achieve high resonant frequencies while maintaining mechanical compliance needed for tunability, and only require small on-chip area. The active area of the NEMS oscillators can be as small as 1 micron by 1 micron, compared to MEMS oscillators which typically occupy more than 100 microns by 100 microns. NEMS oscillators can exhibit resonant frequencies larger than 400 MHz in SiC beams and ~14 MHz in AlN-based resonators, where both systems can be designed for high frequency stability and low phase noise, as opposed to frequency tunability. In addition, due to their small sizes, the motional impedance of NEMS can be large, which can cause its electro-mechanical signal to be overwhelmed by spurious coupling or background noise.

Graphene is an atomically thin, ultra-stiff, yet extremely strong material. Graphene can achieve high resonant frequencies that can be externally tuned over a wide range (up to ~400%) with an application of moderate (<10 V) voltages across the suspended channel and the underlying gate. In addition, its electrically tunable conductance in conjunction with its large electrical mobility allows efficient transduction of mechanical vibration when a graphene membrane is configured as a suspended vibrating field-effect resonator. This can allow a direct radio-frequency (RF) electrical readout with signal to background ratios (SBR) larger than 20 dB at room temperature.

SUMMARY

The disclosed subject matter provides systems and methods for graphene mechanical oscillators with tunable frequencies. In an exemplary embodiment, a nano-electro-mechanical system (NEMS) oscillator is provided. The NEMS oscillator can include an insulating substrate, a source electrode, a drain electrode, a metal local gate electrode, and a micron-size, atomically thin graphene resonator. The source electrode, drain electrode, and metal local gate electrode can be disposed on the substrate. The micron-sized, atomically-thin graphene resonator can be suspended over the metal local gate electrode and define a vacuum gap between the graphene resonator and the metal local gate electrode.

In some embodiments, the graphene resonator can include a suspended strip of chemical vapor deposited (CVD) graphene. The NEMS oscillator can also include a clamping structure for suspending the graphene resonator. The clamping structure can be SU-8 epoxy photoresist. The clamping structure can define a circular graphene drum having a diameter of about 2-4 µm.

In certain embodiments, the NEMS oscillator can further include a tuner for electrostatically tuning an operating frequency of the NEMS oscillator. The frequencies can be electrostatically tuned up to about 400%. The vacuum gap can be between 50 and 200 nm. The substrate can be high-resistivity silicon. The substrate can be an insulating substrate.

In some embodiments, the NEMS oscillator can include a variable gain amplifier and a tunable phase shifter. The NEMS oscillator can be part of a frequency modulated (FM) signal generator.

According to another exemplary embodiment of the disclosed subject matter, a method for fabricating a NEMS oscillator is provided. The method can include growing CVD graphene on substrates, transferring the CVD graphene to a pre-patterned substrate, patterning a source electrode, drain electrode, and clamping structure and releasing the graphene. The substrate can be a copper foil substrate. The pre-patterned substrate can be a high-resistivity silicon.

In particular embodiments, the pre-patterned substrate can include electrodes disposed beneath plasma-enhanced chemical vapor deposition (PECVD) oxide and the method can include planarizing the PECVD oxide with chemical mechanical polishing (CMP). The CMP can promote adhesion between the CVD graphene and the substrate. Patterning can include utilizing electron beam lithography.

In some embodiments, the clamping structure can include SU-8 epoxy photoresist. Releasing the graphene can include placing the NEMS oscillator into buffered oxide etchant. Releasing the graphene can include forming a vacuum gap defined between the graphene and a gate electrode. The method can have a fabrication yield of about 70% or greater for the graphene.

The accompanying drawings, which are incorporated in and constitute part of this specification, are included to illustrate and provide a further understanding of the method and system of the disclosed subject matter. Together with the description, the drawings serve to explain the principles of the disclosed subject matter.

DETAILED DESCRIPTION

The methods and systems presented herein can be used for graphene mechanical oscillators with tunable frequencies. The methods can be applied to any type of 2D materials such as molybdenum disulfide ($MoS_2$), tungsten selenide ($WSe_2$), tungsten disulfide ($WS_2$) and other transition metal dichalcogenides (TMDC's) or 3D films with resonant characteristics. Exemplary oscillators can operate at frequencies that can be electrostatically tuned, for example, up to about 400%. The oscillators can exhibit self-sustaining mechanical motion generated and transduced at room temperature with an aid from an electrical feedback loop. Electro-optical feedback can also be used to generate such oscillation. As such, the voltage-controlled graphene oscillator can exhibit frequency stability and modulation bandwidth suitable for modulation of radio-frequency carrier signals.

Figure 1:
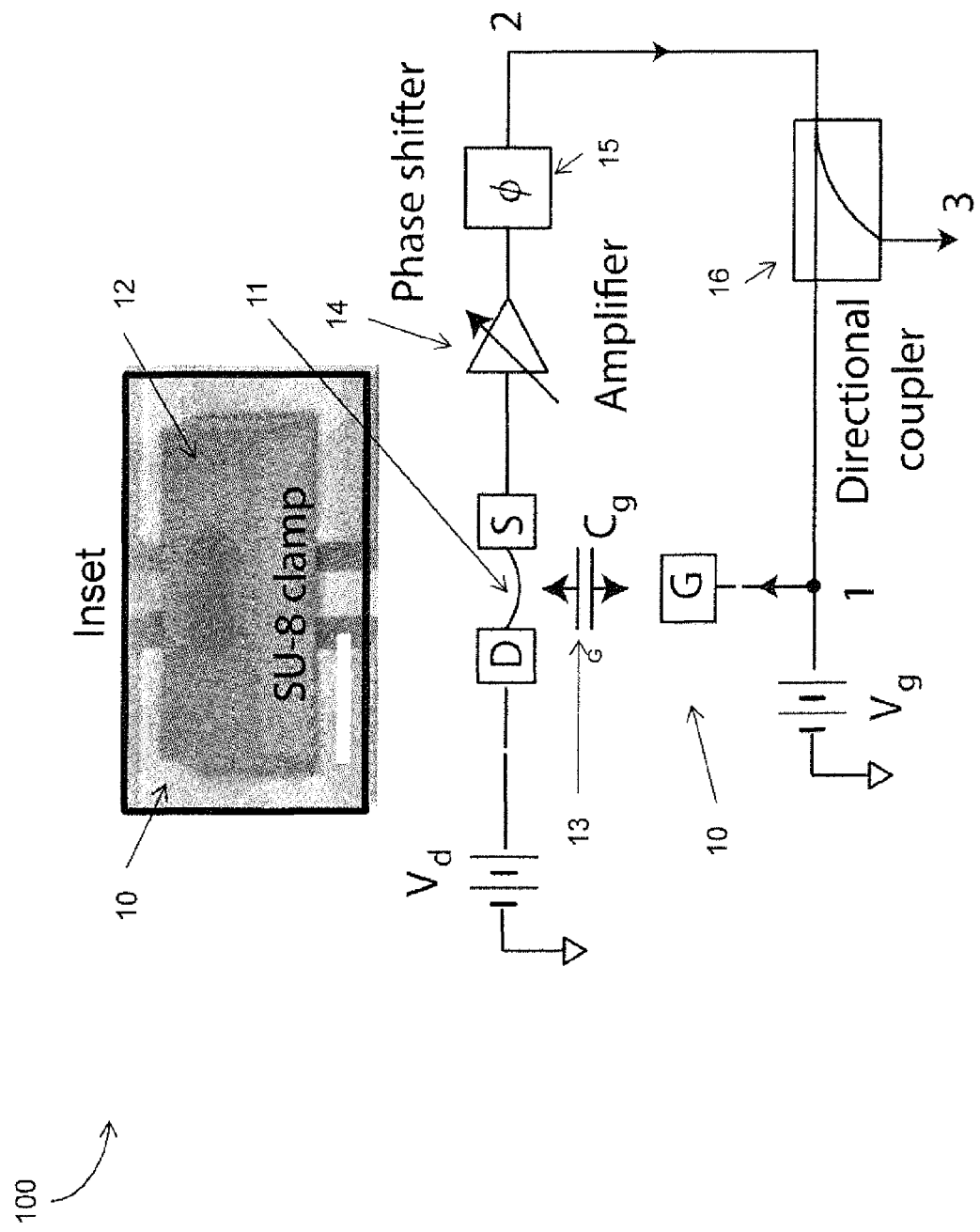
FIG. 1 illustrates an exemplary embodiment of a simplified circuit diagram of self-sustained graphene mechanical oscillators in accordance with the disclosed subject matter.

FIG. 1 shows, for the purpose of illustration and not limitation, a simplified circuit diagram of a self-sustained graphene mechanical oscillator 100 in accordance with an embodiment of the disclosed subject matter. The oscillator can be built on a substrate 10. The substrate can be, for example an insulating substrate. The insulating substrate can be, for example, high-resistivity silicon, quartz, or any substrate with resistivity higher than $10^4$ Ohm-cm. In some embodiments the substrate 10 can be a silicon substrate used for conventional complementary metal oxide semiconductor (CMOS) processes. The oscillator 100 can also include a source electrode (S) and a drain electrode (D) disposed on the substrate 10. The oscillator 100 can also include a metal local gate electrode (G) disposed on the substrate 10. The source and drain electrodes can have have good electrical conductivity and can make good electrical contact to graphene. The local gate electrode can have large overlapping area with graphene, but no direct electrical or mechanical connection in between. In some embodiments, necessary CMOS circuitries can be built underneath a graphene NEMS resonator to constitute three-dimensional (3D) integration.

The oscillator 100 can also include a micron-sized, atomically thin graphene resonator 11. The resonator 11 can also be made from other two-dimensional materials, for example, $MoS_2$, $WSe_2$, $WS_2$ and other TMDC's. The characteristic length of the resonators (for example, diameter for circular shape or longest lateral length for rectangular shape) can be anywhere between sub-micron to tens of microns. The graphene resonator 11 can be a suspended strip. Other suspended geometries, such as rectangles, circles, ellipses, or other similar shapes, can also be used. In addition, CVD, PVD or mechanically exfoliated graphene can be used. Depending on the built-in tension of the suspended graphene membrane, different gate electrodes patterns can be implemented to selectively excite certain higher order modes for enhance quality factor and increased resonant frequency.

The oscillator 100 can also include a clamping structure 12. The clamping structure 12 can be made from SU-8 epoxy photoresist. Other patternable materials, such as hydrogen silsesquioxane (HSQ), poly(methyl methacrylate) (PMMA), NEB, EBR, ZEP, UV-5, UV210, Shipley 1800 series, in addition to other dielectrics such as tungsten oxide or other CMOS gate oxides (hafnium oxide, aluminum oxide, Zirconium dioxide, or other suitable CMOS gate oxides) can also be used as clamping structure, as long as: 1) they are insulating, and 2) they can provide sufficient mechanical stability. The clamping structure can increase mechanical rigidity of the suspended structure. The clamping structure can allow for gate-channel spacing as small as 30 nm with gate-to-suspended graphene dimension (diameter or similar) ratio over 200, and can limit complex vibrational modes due to the unclamped edges, without significantly degrading the electronic performance of underlying graphene. In some embodiments, the clamping structure such as SU-8 epoxy photoresist can be used to define resonator shapes, as the epoxy is patternable with standard photo/e-beam lithography processes. In addition, based on baking conditions of the polymer, built-in tension of the graphene can be changed, to increase or decrease its resonant/oscillation frequency as well as tunability. The clamping material can be any dielectric material. In some embodiments, various clamping shapes can be implemented (for example, rectangular, circular, elliptical, or other suitable shapes) to define suspended graphene resonators of varying sizes—anywhere from less than a micron to tens of microns. Employing such additional clamping, especially when it provides fully-clamped support, the device yield can increase drastically, for example, close to an order of magnitude higher than doubly clamped, bridge type structures.

In accordance with one embodiment of the disclosed subject matter, the clamping structure 12 can define a circular graphene drum having a diameter of about 2-4 μm. Other geometries, such as ellipses, rectangles, can be used, including non-conventional geometries, for example starlike shapes. The oscillator 100 can include a vacuum gap 13 defined between the graphene resonator 11 and the metal local gate electrode (G), creating a capacitor $C_g$. For example, the vacuum gap can be between sub-30 nm to over 1 micron. Smaller gaps can lead to higher frequency tenability in terms of percent frequency shift per volt, as well as an increase in electro-mechanical transduction, which can improve the signal-to-background ratio (SBR). The oscillator 100 can also include a variable gain amplifier 14, tunable phase shifter 15, and directional coupler 16. An exemplary amplifier can include Mini-Circuits ZFL-1000G, exemplary phase shifters can include products from Lorch Microwave, and an exemplary coupler can include Mini-Circuits ZFDC-20-5+. In some embodiments other known amplifiers, phase shifters or directional couplers can be used.

Figure 2:
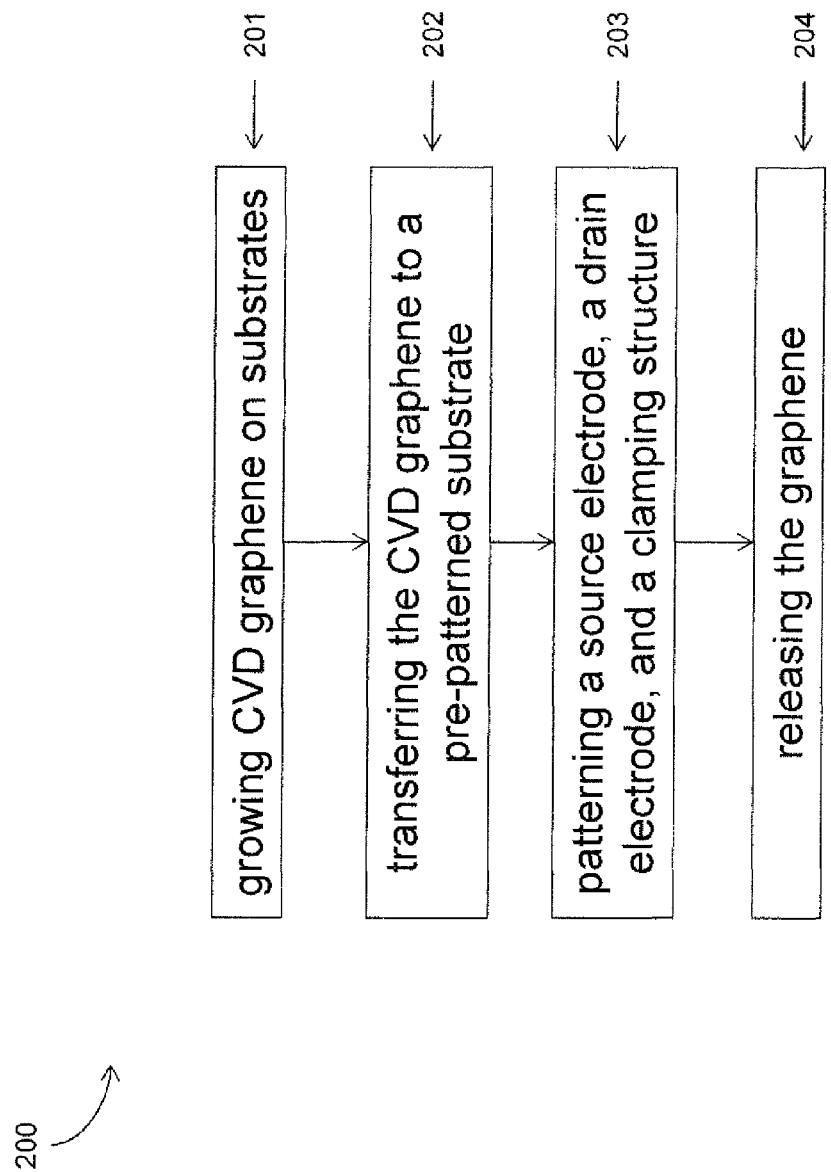
FIG. 2 illustrates an exemplary embodiment of a method for fabricating a nano-electro-mechanical systems oscillator in accordance with the disclosed subject matter.

FIG. 2 shows, for the purpose of illustration and not limitation, an exemplary embodiment of a method (200) for fabricating a NEMS oscillator. The method can include growing CVD, PVD, or mechanically exfoliated graphene on substrates (201). The growth substrate can be copper-based, or other metal-based substrates can be used, such as nickel. Additionally, silicon carbide (SiC) substrates can be used. Graphene can be physically peeled off after metal deposition onto the graphene on SiC.

The method (200) can also include transferring the CVD graphene from the substrate. Graphene is transferred to a pre-patterned substrate (202), after removing the unwanted graphene grown on backside of the copper foil using oxygen plasma, and etching the copper away in a copper etchant such as ammonium persulfate. The pre-patterned substrate can be made of an insulating material such as quartz, high-resistivity silicon, or a silicon wafer used for conventional CMOS processes. The substrate can include electrodes deposited beneath PECVD or PEALD oxide, where various types of oxide or metals could be used, as described in greater detail above. The method can also include planarizing the PECVD oxide with chemical mechanical polishing (CMP). The CMP can promote adhesion between the CVD graphene and the substrate.

The method (200) can further include patterning a source electrode, a drain electrode and a clamping structure (203) on the substrate. Patterning can be performed with electron beam lithography, photolithography, or shadow masking.

The method (200) can also include releasing the graphene (204). The graphene channel can be released by placing the NEMS oscillator into BOE or HF, followed by de-ionized (DI) water rinse and CPD or boiling solvents such as isopropanol, ethanol, acetone, or methanol. If the material beneath graphene is not oxide but other dielectric or metallic, appropriate acids, bases, or solvents can be used to etch the material away, followed by DI water rinse or solvent rinse and CPD. For instance, if copper oxide or aluminum was used to clad the local gate, copper etchant or aluminum etchant can be used in place of BOE or HF. Releasing graphene can include forming a vacuum gap defined between the graphene and the gate electrode. The method can include a fabrication yield of about 70% or greater for the graphene owing to the full-clamp support by SU-8.

In some embodiments, the metal local gate can be deposited using e-beam or thermal metal evaporations before cladded by oxide dielectric using deposition techniques such as plasma-enhanced chemical vapor deposition (PECVD) or plasma-enhanced atomic layer deposition (PEALD) or spin-on-glass type chemical deposition. After surface planarization such as dilute buffered-oxide etch (BOE) or hydrofluoric acid (HF) treatment or chemical mechanical polishing (CMP) to promote the adhesion of graphene, graphene can be deposited using mechanical exfoliation, chemical vapor deposition (CVD), or physical vapor deposition (PVD). The source electrode and drain electrodes can then be deposited to establish electrical contacts, to the underlying circuitries if necessary, and additional dielectric clamping can be added on using materials such as SU-8. Finally, through the ROE or HF release, followed by critical point dry (CPD), to under-etch the oxide dielectric underneath the graphene channel minimizing stiction, the micron-sized, atomically thin graphene resonator can be suspended over the metal local gate electrode, and a vacuum gap between the graphene resonator and the metal local gate electrode is created.

Example 1

Referring again to FIG. 1, for the purpose of illustration and not limitation, the graphene oscillator can include a suspended strip of chemical vapor deposited (CVD) graphene, metal electrodes, and a clamping structure made from SU-8 epoxy photoresist that defines a circular graphene drum 2-4 µm in diameter. The graphene is suspended over a metal local gate electrode on an insulating substrate, as shown in FIG. 1. The SU-8 polymer clamping can increase the mechanical rigidity of the suspended structure, allowing for a gate-channel spacing as small as 50 nm, and can eliminate complex vibrational modes due to unclamped edges, without significantly degrading the electronic performance of underlying graphene. Field effect mobilities of up to 6,000 cm$^2$/Vs were observed, similar to devices without SU-8 support. Following fabrication, the mechanical resonance of each device is measured. An application of a direct current (DC) and RF bias (combined with a bias tee) to the gate drives the graphene resonator. The resonant signal is read out by applying a second DC bias to the drain. On resonance, the motion of the graphene modulates the charge density, which in turn modulates the conductance and drain current. The electrical actuation and detection are performed using a vector network analyzer (VNA), which allows measurement of both the signal amplitude and phase. The large electronic mobility of graphene, combined with high mechanical compliance (spring constant ranges from 0.1 to 1 N/m; mechanical compliance ranges from 10 to 1 m/N) can lead to efficient electro-mechanical coupling; small gate spacing (200 nm, equivalent to static capacitance of 44 aF/µm$^2$) and large sample size also contribute to high SBR even at room temperature, and facilitates direct electrical transduction of the mechanical motion.

Figure 3B:
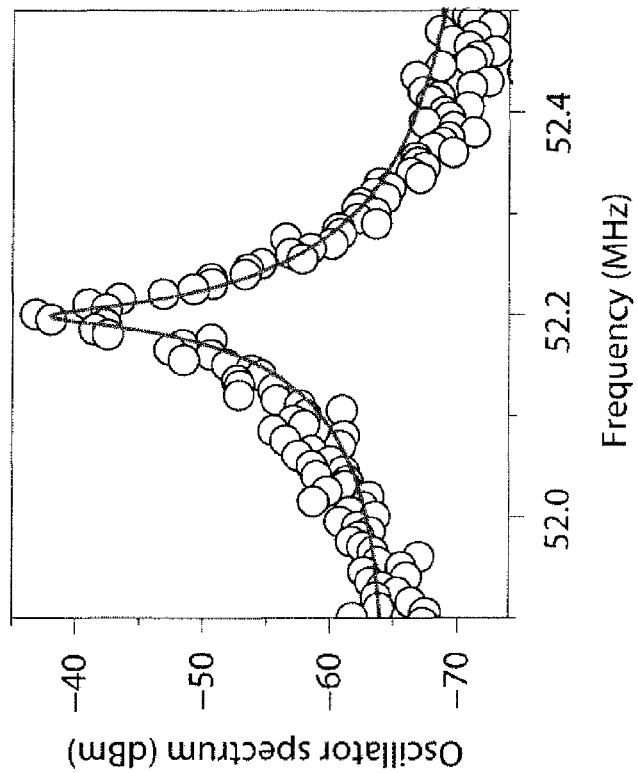
FIG. 3B illustrates an output power spectrum (black circles) of graphene mechanical oscillator for sample 1.
Figure 3A:
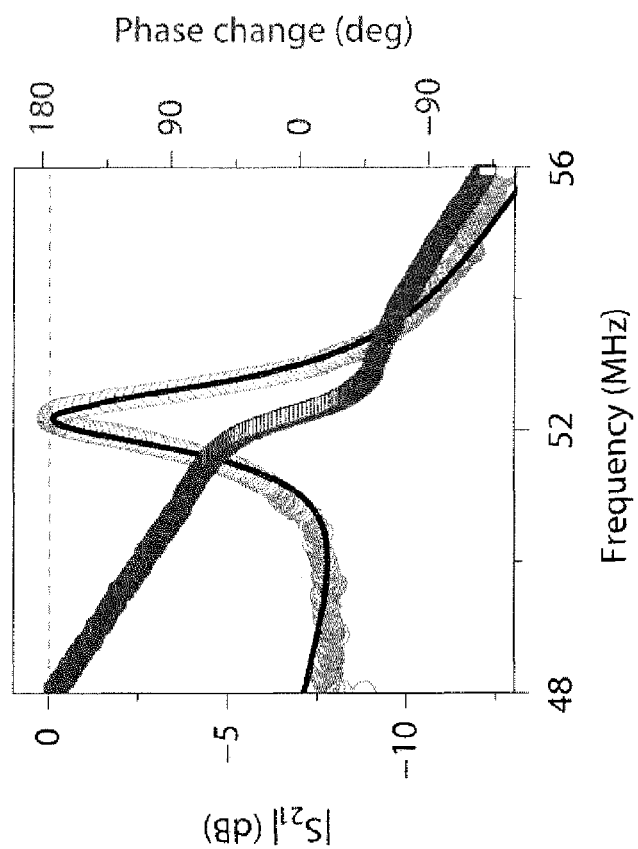
FIG. 3A illustrates an open-loop (resonator) transmission $S_{21}$ measurement for an exemplary embodiment of the disclosed subject matter (sample 1) of both magnitude (squares) and phase (circles).

To achieve self-oscillation, the system should satisfy the Barkhausen criterion: the open-loop gain must be unity, and the feedback phase must be an integer multiple of $2\pi$. A resonator is first characterized in an open-loop configuration by measuring its forward transmission coefficient, $S_{21}$, between nodes 1 and 2 (FIG. 1). The gain at resonance was set to unity with a variable gain amplifier, and the phase was adjusted to zero with a tunable phase shifter. FIG. 3A illustrates both the magnitude and phase of the measured $S_{21}$ of sample 1 (4 µm diameter drum, 200 nm vacuum gap), with both the Barkhausen criteria met. As the feedback loop is closed to generate self-oscillations, a 20 dB directional coupler is placed in the loop to monitor the oscillator's power spectrum and waveform in the time domain (node 3 in FIG. 1). FIG. 3B illustrates the power spectrum of sample 1 under the same configuration shown in FIG. 3A. It shows clear self-oscillation at the open-loop resonant frequency.

A distinctive signature of oscillators is the spectral linewidth compression compared to the corresponding passive resonators. The mechanisms of linewidth broadening in resonators and oscillators are inherently different: in resonators, the finite linewidth is due to the energy dissipation during each vibration cycle, and quantified by the quality factor, Q; in oscillators, the finite spectral linewidth is mostly due the phase noise, and quantified by the spectrum power density away from carrier frequency. Nevertheless, for the sake of direct comparison and without losing the generality, full width at half maximum (FWHM), $\Delta$, was used as the characteristic linewidth for both resonators and oscillators. For sample 1 (discussed above), the resonator linewidth is:

$$\Delta^{res} = f_o^{res}/Q^{res} \approx 935 \text{ kHz} \qquad (1)$$

where $f_0^{res}$=52.19 MHZ is the resonant frequency and $Q^{res} \approx 55$. The oscillator has spectral linewidth of:

$$\Delta^{osc} = f_0^{osc}/Q_{eff}^{osc} \approx 13 \text{ kHz} \qquad (2)$$

with oscillation frequency $f_o^{osc}$=52.20 MHz, and an effective quality factor $Q_{eff}^{osc} \approx 4.015$. The linewidth compression ratio $\Delta^{osc}/\Delta^{res}$ is 72 in this case. It was observed that the oscillator power spectrum is sensitive to feedback loop gain and phase, which can modify apparent $f_o^{osc}$ and $\Delta^{osc}$.

Figure 4B:
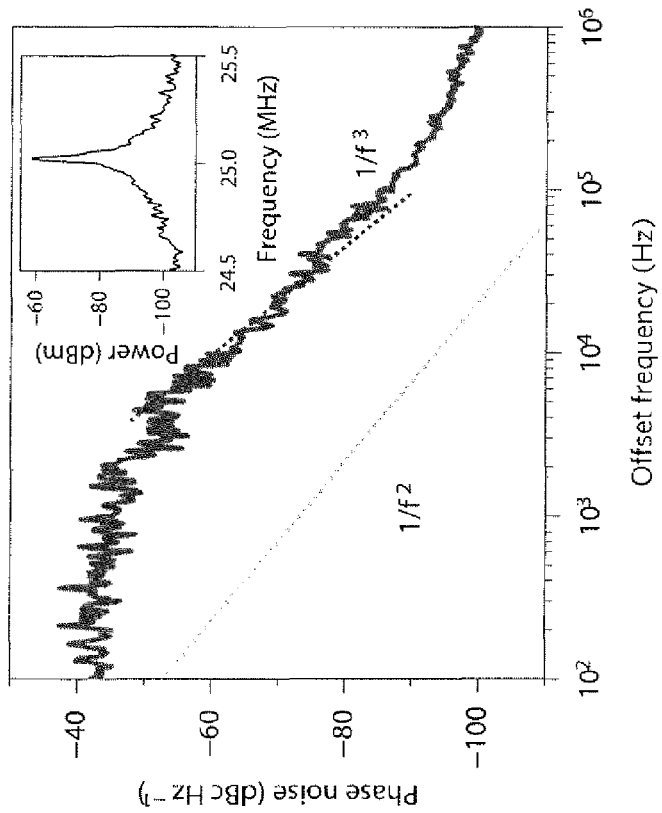
FIG. 4B illustrates phase noise as a function of offset frequency from carrier.
Figure 4A:
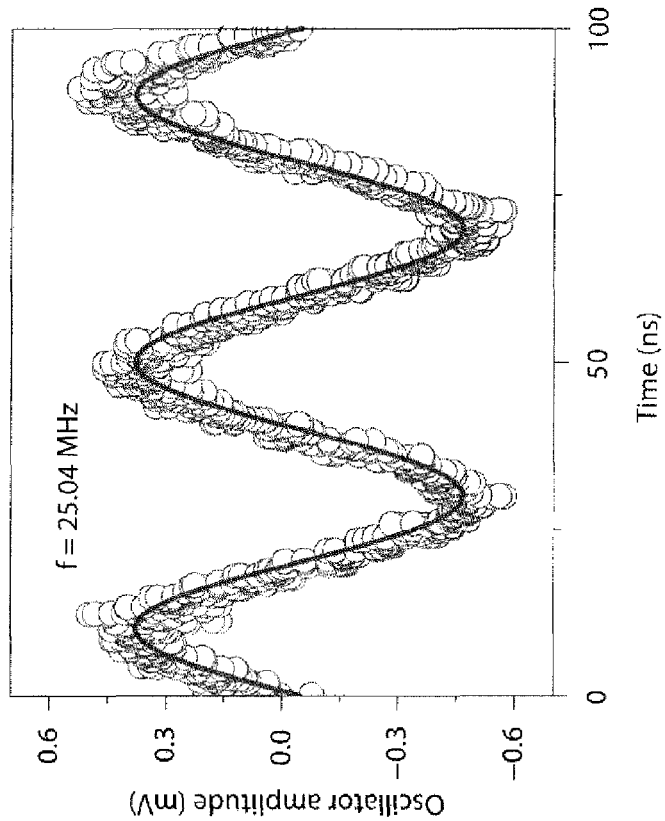
FIG. 4A illustrates a time-domain waveform (circles) of graphene mechanical oscillation acquired by digital oscilloscope.

FIG. 4A shows, for the purpose of illustration and not limitation, the time domain response of sample 2 (2 μm diameter drum, 200 nm vacuum gap), displaying clear sinusoidal waveform with peak-to-peak amplitude of 0.8 mV, corresponds to vibrational amplitude of 0.14 nm. The corresponding phase noise is shown in FIG. 4B, for the purpose of illustration and not limitation. It is constant up to 2 kHz offset-frequency, then decreases with a $1/f^3$ slope. The origin of the flat plateau is the Lorentzian-nature linewidth broadening of the resonator from white noise coupling into the gate, and the $1/f^3$ dependence is due to the $1/f$ (flicker) noise. The expected $1/f^2$ contribution from thermal (white) noise was not observed, which indicates that the stability of the graphene mechanical oscillation is still limited by external circuitry (for example the DC gate voltage source and feedback amplifiers). To estimate the potential for improvement, the intrinsic phase noise due to thermal sources given by:

$$L(f) = 10\log\left[\frac{k_B T f_0^{res2}}{2 P_C Q^{res2} f^2}\right] \quad (3)$$

where f is the offset frequency, $k_B$ is the Boltzmann constant, T is the temperature and $P_C$ is the carrier power, was calculated. The intrinsic phase noise of sample 2 ($P_C \approx 126$ nW, and $Q^{res} \approx 15$) is shown as the dashed line in FIG. 4B. The intrinsic phase noise at an offset frequency of 1 kHz equals to −73 dBc/Hz, which is more than two orders of magnitude smaller than observed value. Graphene oscillator built based on samples with higher open-loop Q do not show improved phase noise, further indicating that different processes are responsible for linewidth broadening in the open-loop and closed-loop configuration. Furthermore, since the close-loop oscillators are running inside the nonlinear regime, amplifier noises can be evaded by setting the open-loop condition at special operation points.

Because graphene is atomically thin, its resonant frequency is dominated by in-plane tension, which can be modified electrostatically by applying a DC voltage $V_g$ to the back gate. The degree of tunability depends on the initial built-in tension, and can reach 400% with reduced built-in tension (the devices used herein can show smaller tunability due to tension imparted by the SU-8 claims). The same tuning mechanism can be readily used to realize highly tunable VCOs.

Figure 5B:
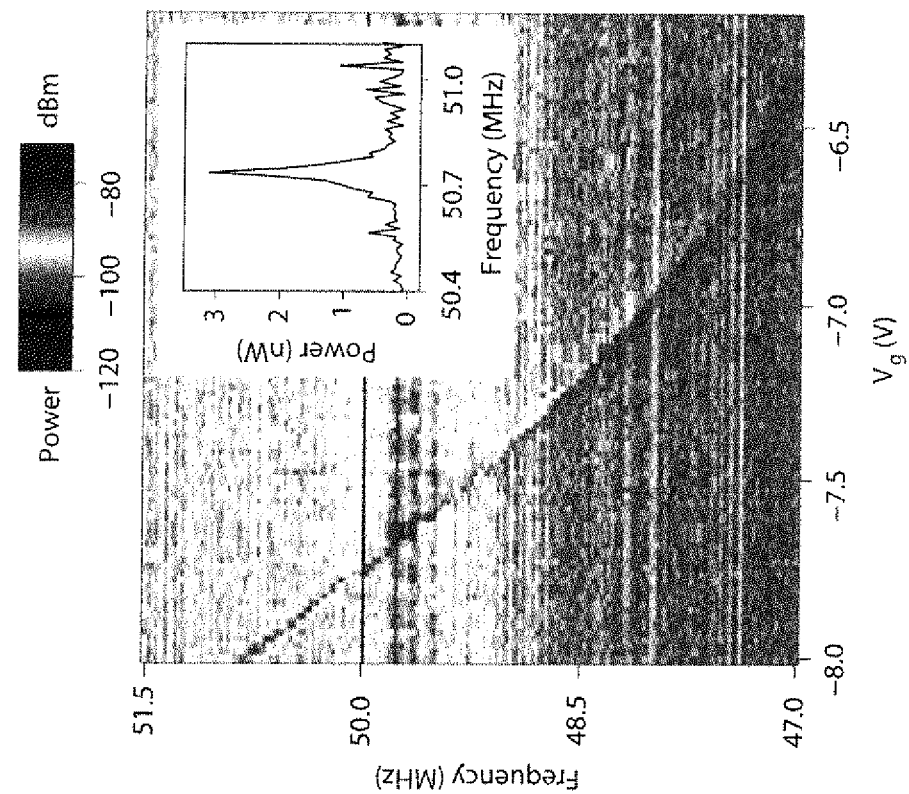
FIG. 5B illustrates two measurements: an oscillation power spectrum under the same condition as FIG. 5A and a power spectrum in linear scale for $V_g=-8V$.
Figure 5A:
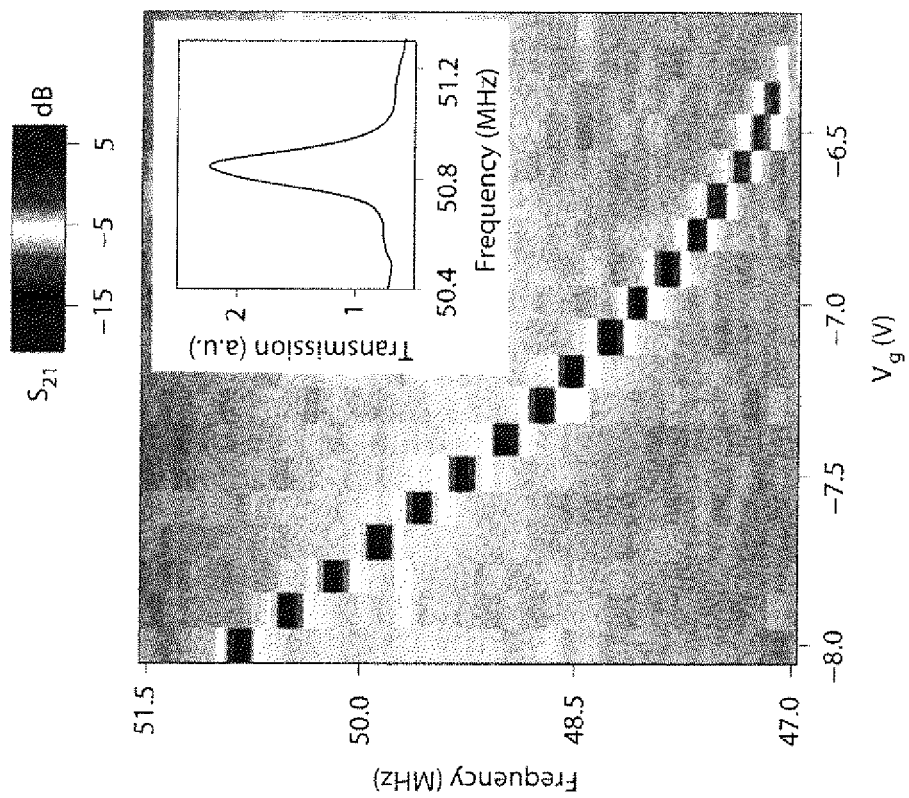
FIG. 5A illustrates two measurements: an open-loop transmission $S_{21}$ measurement and an open-loop transmission in linear scale for $V_g=-8V$.

FIG. 5A shows, for the purpose if illustration and not limitation, open-loop characterization of sample 3 (no SU-8 support, 4.2 μm long and 2 μm wide, 200 nm vacuum gap): in applied $V_g$ range from −8 V to −6.2 V, there is clear resonance tuning from 51.5 MHz to 47 MHz. After closing the positive feedback loop, there is similar oscillation frequency tuning with $V_g$ faithfully follows the dependence, as shown in FIG. 5B, for the purpose of illustration and not limitation. The tuning sensitivity for this sample is about 2.7 MHz/V, comparable to commercial very high frequency (VHF) VCOs; devices with lower built-in tension showed tuning sensitivity up to 8 MHz/V. The tuning range in this work is limited by the external feedback circuit, which introduces extra phase shifts during the frequency tuning to violate the Barkhausen criteria. This can be overcome by manual adjustment of phase delay at individual operation point: which allows tuning up to 14% in this way. On-chip readout circuitry or software-controlled phase compensation can largely eliminate this tuning range limitation. For comparison, the tunability of commercial VHF VCOs available from Mini Circuits ranges from 0.11% to 106%, with corresponding tunability from 1.5 MHz/V to 161 MHz/V.

In accordance with the disclosed subject matter, NEMS can be used for mechanical RF signal processing, as elements such as filters, modulators, mixers, and radio receivers based on both carbon nanotubes and Si-NEMS. Graphene VCO can be used to create the complementary structure—a NEMS radio transmitter, which up-converts an audio signal into a frequency-modulated (FM) carrier signal. Graphene VCOs are well suited for this application: their oscillation frequencies can be tuned into the FM broadcast band (87.7 MHz to 109 MHz) with proper device geometry design. Moreover, the modulation bandwidth, which quantifies how rapidly the VCO can respond to changes in tuning voltage, is sufficient for audio signals (above 15 kHz in the prototype, currently limited by the cut-off frequency of DC port in the bias tee used in the test circuitry).

Figure 6A:
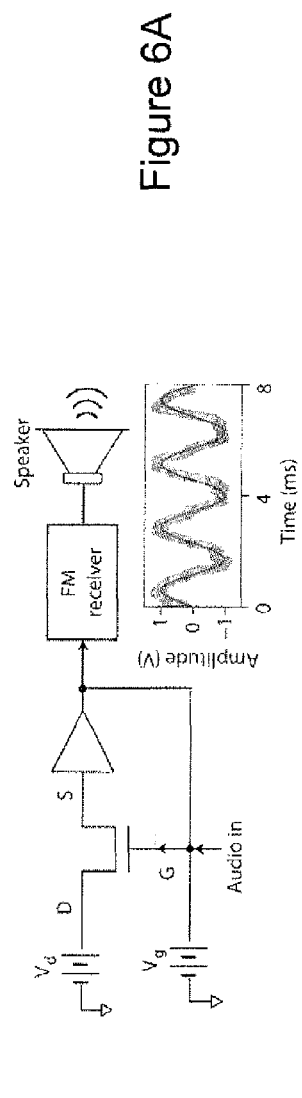
FIG. 6A illustrates a simplified circuit diagram of graphene radio station. Inset: received 440 Hz signal (circles) after FM demodulation, and sinusoidal fit.
Figure 6B:
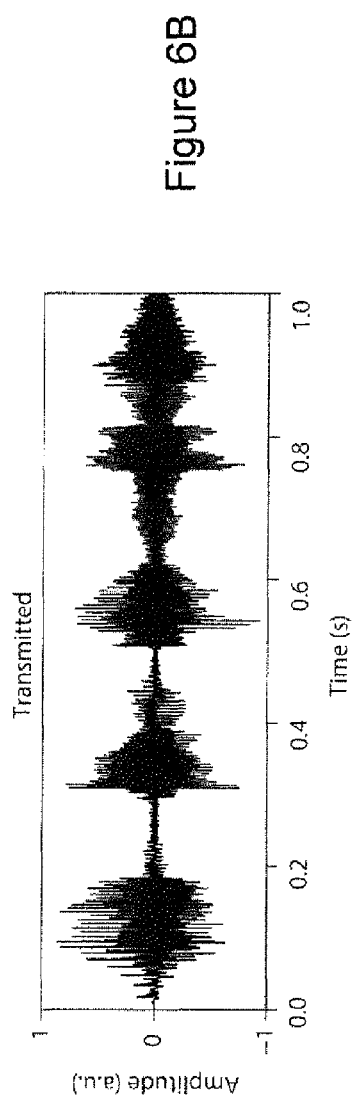
FIG. 6B illustrates an audio waveform of 1 second soundtrack of "Gangnam Style" by PSY, transmitted through the graphene radio station.
Figure 6C:
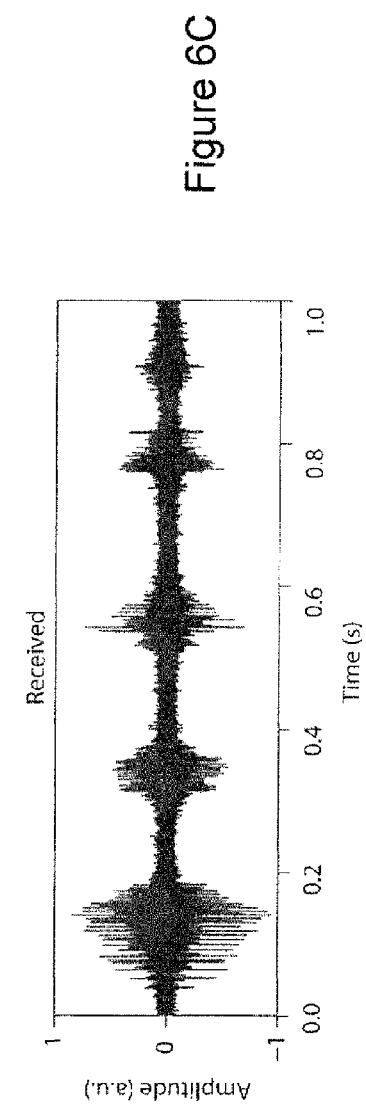
FIG. 6C illustrates that the audio waveform of the received soundtrack by FM receiver faithfully reproduced the original audio signal.

As depicted in FIG. 6A, for the purpose of illustration and not limitation (sample 4, 3 μm diameter drum, 200 nm vacuum gap), the audio signal is added to the DC gate bias, modulating the output frequency and generating an FM signal at the carrier frequency (~100 MHz). The signal was fed directly into a commercial FM receiver to recover the original audio signal. Before sending in complex multi-frequency signals, a pure sinusoid signal at 440 Hz was transmitted, and the down-converted signal was acquired with a digital oscilloscope, as shown in the insert of FIG. 6A. The total harmonic distortion is 9.4% up to the $20^{th}$ harmonic. A more complex music waveform was transmitted, and the de-modulated output was connected directly to a speaker. FIGS. 6B and 6C show, for the purpose of illustration and not limitation, 1 second segments of original and received audio waveforms of "Gangnam Style" by PSY. A signal that reproduces the original was recovered. If the frequency of the FM receiver was detuned, the sound was lost, confirming the validity of the graphene VCO operation.

Graphene mechanical oscillators with tunable frequency operation at room temperature are provided. The high quality CVD graphene described herein can indicate wafer-scale integration of graphene resonant NEMS, which is compatible with certain CMOS fabrication processes. Beyond the graphene radio station described above, there are certain immediate applications that can utilize nano-scale, tunable VCOs, such as in situ mass sensing and RF signal processing, and noise suppression with frequency synchronization.

All samples, except for sample 3, are derived from CVD graphene grown on copper foil substrates. The CVD graphene was transferred to pre-patterned substrates made from high-resistivity silicon, with gate electrodes buried under plasma-enhanced chemical vapor deposition (PECVD) oxide. The PECVD oxide was planarized with chemical mechanical polishing (CMP), in order to promote the adhesion between the CVD graphene and the substrate. After patterning source (S), drain (D) electrode and SU-8 polymer for circular clamping with electron beam lithography, the whole sample was immersed into buffered oxide etchant (BOE) to release the suspended graphene drum resonators. Vacuum gap between graphene and underneath local gate is controlled by PECVD oxide thickness and CMP duration: vacuum gap can be 50 nm to 200 nm, and fabrication yield greater than 70% for suspending graphene can be achieved.

To fabricate sample 3, graphene was directly exfoliated onto pre-patterned electrodes having a trenched structure.

All examples were carried out in a high-vacuum ($<10^{-5}$ Torr) probe station. Samples with large open-loop SBR ($>5$ dB) were used to construct graphene mechanical oscillators. To adjust the feedback phase and gain, phase shifters (Lorch Microwave) and a tunable amplifier (Mini-circuits ZFL-1000G) were used. Upon confirming that the open-loop gain is unity and the total phase shift is multiple of $2\pi$, the loop was closed by connecting node 1 and 2 (as shown in FIG. 1).

Closed-loop measurements were performed with spectrum analyzer (Agilent E4440A) for both spectral characterization and phase noise measurement (option 226). The time domain data is acquired using Agilent mixed signal oscilloscope (MSO-X 2014A).

In modulation bandwidth test, a square wave with 0.4 V peak-to-peak value was added for modulation (Stanford Research System DS345). The applied modulation frequency is from 1 Hz to 100 kHz. The DC voltage and low frequency modulation signal are combined with summing amplifier (Stanford Research System SIM 980), and then applied to the DC port of the bias tee while the RF excitation is applied to the RF port.

The measurement setup of FM transmission is similar to that of the modulation bandwidth test. Instead of the square-wave an audio signal was applied to the summing amplifier, and graphene acts as both oscillator and mixer, allowing for FM transmission. The modulated signal is then transmitted to the standard radio receiver (NAD Stereo Tuner 4220) where the sounds signal is demodulated before played through a speaker.

While the disclosed subject matter is described herein in terms of certain exemplary embodiments, those skilled in the art will recognize that various modifications and improvements can be made to the disclosed subject matter without departing from the scope thereof. Moreover, although individual features of one embodiment of the disclosed subject matter can be discussed herein, or shown in the drawing of one of the embodiments and not in another embodiment, it should be apparent that individual features of one embodiment can be combined with one or more features of another embodiment or features from a plurality of embodiments. Thus, the foregoing description of specific embodiments of the disclosed subject matter has been presented for purposes of illustration and description. It is not intended to be exhaustive or to limit the disclosed subject matter to those embodiments disclosed.

The invention claimed is:

1. A nano-electro-mechanical systems (NEMS) oscillator, comprising:
an insulating substrate;
a source electrode and a drain electrode disposed on the substrate;
a metal local gate electrode disposed on the substrate; and
a micron-size, atomically thin graphene resonator suspended over the metal local gate electrode and defining a vacuum gap between the graphene resonator and the metal local gate electrode;
wherein a degree of tunability depends on an initial built in tension of the graphene resonator.

2. The NEMS oscillator of claim 1, wherein the graphene resonator comprises a suspended strip of chemical vapor deposited (CVD) graphene.

3. The NEMS oscillator of claim 1, further comprising a clamping structure for suspending the graphene resonator.

4. The NEMS oscillator of claim 3, wherein the clamping structure comprises SU-8 epoxy photoresist.

5. The NEMS oscillator of claim 3, wherein the clamping structure defines a circular graphene drum having a diameter of about 2-4 μm.

6. The NEMS oscillator of claim 1, further comprising a clamping structure comprising SU-8 epoxy photoresist for suspending the graphene resonator and wherein the graphene resonator comprises a suspended strip of CVD graphene.

7. The NEMS oscillator of claim 1, further comprising a tuner for electrostatically tuning an operating frequency of the NEMS oscillator.

8. The NEMS oscillator of claim 7, wherein the frequencies can be electrostatically tuned up to about 400%.

9. The NEMS oscillator of claim 1, wherein the vacuum gap is between about 50 and 200 nm.

10. The NEMS oscillator of claim 1, wherein the substrate comprises high-resistivity silicon.

11. The NEMS oscillator of claim 1, further comprising a variable gain amplifier and a tunable phase shifter.

12. A frequency modulated (FM) signal generator comprising:
a nano-electro-mechanical systems (NEMS) oscillator including
a substrate;
a source electrode and a drain electrode disposed on the substrate;
a metal local gate electrode disposed on the substrate; and
a micron-size, atomically thin graphene resonator suspended over the metal local gate electrode and defining a vacuum gap between the graphene resonator and the metal local gate electrode;
wherein a degree of tunability depends on an initial built in tension of the graphene resonator.

13. A method for fabricating a NEMS oscillator, comprising:
growing a micron-sized, atomically thin CVD graphene on one or more copper foil substrates;
transferring the CVD graphene to a pre-patterned substrate;
patterning a source electrode, a drain electrode, and a clamping structure; and releasing the graphene;
wherein a degree of tunability depends on an initial built in tension of the graphene.

14. The method of claim 13, wherein the pre-patterned substrate comprises high-resistivity silicon.

15. The method of claim 14, wherein the pre-patterned substrate comprises electrodes disposed beneath plasma-enhanced chemical vapor deposition (PECVD) oxide and wherein the method further comprises planarizing the PECVD oxide with chemical mechanical polishing (CMP).

16. The method of claim 15, wherein the CMP promotes adhesion between the CVD graphene and the substrate.

17. The method of claim 13, wherein patterning further comprises utilizing electron beam lithography.

18. The method of claim 13, wherein the clamping structure comprises SU-8epoxy photoresist.

19. The method of claim 13, wherein releasing the graphene further comprises placing the NEMS oscillator into buffered oxide etchant (BOE).

20. The method of claim 13, wherein releasing the graphene further comprises forming a vacuum gap defined between the graphene and a gate electrode.

21. The method of claim 13, wherein the method comprises a fabrication yield of about 70% or greater for the graphene.

* * * * *